(12) United States Patent
Lim

(10) Patent No.: US 7,020,504 B2
(45) Date of Patent: Mar. 28, 2006

(54) CIRCUIT AND METHOD FOR PROCESSING A MALFUNCTION OF A HALL EFFECT SWITCH USED FOR RECOGNITION OF AN OPEN/CLOSE STATE OF A FLIP OR A FOLDER TYPE TERMINAL

(75) Inventor: Heui-Do Lim, Suwon-shi (KR)

(73) Assignee: Samsung Electronics Co., Ltd., (KR)

( * ) Notice: Subject to any disclaimer, the term of this patent is extended or adjusted under 35 U.S.C. 154(b) by 437 days.

(21) Appl. No.: 10/410,450

(22) Filed: Apr. 9, 2003

(65) Prior Publication Data

US 2004/0203534 A1    Oct. 14, 2004

(30) Foreign Application Priority Data

Apr. 11, 2002   (KR) ............................... 2002-19818

(51) Int. Cl.
*H04B 1/38*    (2006.01)
*H04M 1/00*    (2006.01)
(52) U.S. Cl. ............................... 455/575.3; 455/575.1; 455/90.3
(58) Field of Classification Search ............ 455/550.1, 455/575.1, 575.3, 90.3
See application file for complete search history.

(56) References Cited

U.S. PATENT DOCUMENTS

| | | | |
|---|---|---|---|
| 5,192,877 A | * | 3/1993 | Bittebierre et al. ............ 327/73 |
| 5,473,250 A | * | 12/1995 | Dillman ....................... 324/251 |
| 5,844,411 A | * | 12/1998 | Vogt ........................... 324/537 |
| 6,265,864 B1 | * | 7/2001 | De Winter et al. ...... 324/207.2 |
| 2002/0068533 A1 | * | 6/2002 | Bilotti et al. ................. 455/90 |

* cited by examiner

*Primary Examiner*—Nick Corsaro
*Assistant Examiner*—Raymond B. Persino
(74) *Attorney, Agent, or Firm*—Dilworth & Barrese LLP

(57) ABSTRACT

A circuit and method of processing malfunction of a hall effect switch used for recognition of an open/close state of a flip or folder of a terminal. The circuit includes an output terminal of the hall effect switch for outputting a first-state or second-state signal that indicates the open/close state of the flip or folder by sensing change of a magnetic field according to opening/closing of the flip or folder, a flip/folder-state input terminal for transferring the first-state or second-state signal to a control section of the terminal, a first pull-up resistor connected to the flip/folder-state input terminal, a ripple-removing capacitor connected to the flip/folder-state input terminal, and a second resistor of which one terminal is connected to the output terminal of the hall effect switch and the other terminal is connected to a connection point of the first resistor and the capacitor.

5 Claims, 4 Drawing Sheets

CIRCUIT AND METHOD FOR PROCESSING A MALFUNCTION OF A HALL EFFECT SWITCH USED FOR RECOGNITION OF AN OPEN/CLOSE STATE OF A FLIP OR A FOLDER TYPE TERMINAL

PRIORITY

This application claims priority to an application entitled "Circuit and Method of Processing Malfunction of Hall Effect Switch Used For-Recognition of Open/Close State of Flip or Folder of Mobile Terminal" filed in the Korean Industrial Property Office on Apr. 11, 2002 and assigned Serial No. 2002-19818, the contents of which are hereby incorporated by reference.

BACKGROUND OF THE INVENTION

1. Field of the Invention

The present invention relates to a flip or folder type terminal and more particularly to a circuit and method for processing a malfunction of a hall effect switch used for recognition of an open/close state of a flip or a-folder of a flip or folder type terminal.

2. Description of the Related Art

Generally, a mobile terminal (e.g., a portable phone) is classified into three types, i.e., a bar type, a flip type, and a folder type. In the flip type and folder type terminal, a magnet is attached to the flip or the folder, respectively, and a hall effect switch is mounted on a position opposite to the flip or the folder. When the flip or the folder is opened, the hall effect switch moves away from the magnet, while when it is closed, the hall effect switch moves nearer to the magnet. Accordingly, the hall effect switch senses a change of a magnetic field generated from the magnet.

The hall effect switch is a kind of logic IC (Integrated Circuit) including a timer that operates at predetermined intervals. That is, the hall effect switch senses the strength of the magnetic field at the predetermined intervals, and outputs a high or low level signal according to the sensed strength of the magnetic field. Thus, if the high level signal is input to an a control section of the mobile terminal, the control section recognizes that the flip or folder is opened. On the contrary, if the low level signal is inputted, the control section recognizes that the flip or folder is closed.

FIG. 1 is a schematic diagram of an apparatus for recognizing an open/close state of a flip or a folder in a conventional terminal. In FIG. 1, a hall effect switch senses a change of a magnetic field according to an opening/closing of the flip or the folder, and provides through its output terminal 100 a high or low level signal to a flip/folder-state input terminal 200 of a control section as a result of sensing. A resistor R1 and a capacitor C1 are connected to an output terminal 100 of the hall effect switch and the flip/folder-state input terminal 200 of the control section. Here, the resistor R1 is a pull-up resistor of which one terminal is connected to a supply voltage Vcc. The capacitor C1 is a ripple-removing capacitor of which one terminal is connected to ground.

The operation of the apparatus illustrated in FIG. 1 will be described with reference to FIGS. 2A and 2B herein below.

FIG. 2A illustrates a normal-state signal output from the output terminal of the hall effect switch 100. The falling edge S1 illustrated in FIG. 2A represents a closed flip or folder. Specifically, in an open state of the flip or folder, the output terminal of the hall effect switch 100 outputs a high level signal, and if the user closes the flip or folder, the output terminal of the hall effect switch 100 outputs a low level signal.

FIG. 2B illustrates an abnormal-state signal output from the output terminal of the hall effect switch 100. When a user makes a call, a magnetic field may be produced due to current flowing through a battery. The hall effect switch may also sense such a change of the magnetic field. In other words, the hall effect switch may also sense changes in the magnetic field produced by components and reasons other than changes caused by the opening/closing of the flip or the folder. As a result, the flip/folder-state input terminal of the control section 200 may incorrectly sense an open/close state of the flip or the folder.

As illustrated in FIG. 2B, an abnormal-state signal is output, for example, in a manner that the output of the hall effect switch changes from the high level to the low level, and then changes from the low level to the high level at short time intervals, and vice versa.

As described above, if the flip/folder-state input terminal of the control section 200 incorrectly recognizes an open/close state of the flip or the folder, it causes a great inconvenience in use. For example, in a portable phone, a call may be abruptly disconnected. Also, even when using other functions of the terminal, the corresponding functions cannot be properly performed and will be terminated.

Therefore, a need exists for a system and method for identifying and correcting malfunctions in hall effect switches in flip type and folder type terminals.

SUMMARY OF THE INVENTION

Accordingly, the present invention has been designed to solve the above-mentioned problems occurring in the prior art, and an object of the present invention is to provide a circuit and method for processing a malfunction of a hall effect switch used for recognition of an open/close state of a flip or a folder of a terminal.

In order to accomplish the above and objects, there is provided a circuit for processing a malfunction of a hall effect switch used for recognition of an open/close state of a flip or a folder of a terminal, comprising: an output terminal of the hall effect switch for outputting a first-state or a second-state signal that indicates the open/close state of the flip or the folder by sensing a change of a magnetic field according to opening/closing of the flip or the folder; a flip/folder-state input terminal for transferring the first-state or the second-state signal to a control section of the terminal; a first pull-up resistor connected to the flip/folder-state input terminal; a ripple-removing capacitor connected to the flip/folder-state input terminal; and a second resistor of which one terminal is connected to the output terminal of the hall effect switch and the other terminal is connected to a connection point of the first resistor and the capacitor.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

A circuit and method for processing a malfunction of a hall effect switch used for recognition of an open/close state of a flip or a folder of a terminal according to preferred embodiments of the present invention will be described herein below with reference to the accompanying drawings. In the following description of the present invention, a detailed description of known functions and configurations incorporated herein will be omitted when it may make the subject matter of the present invention rather unclear.

Figure 3:
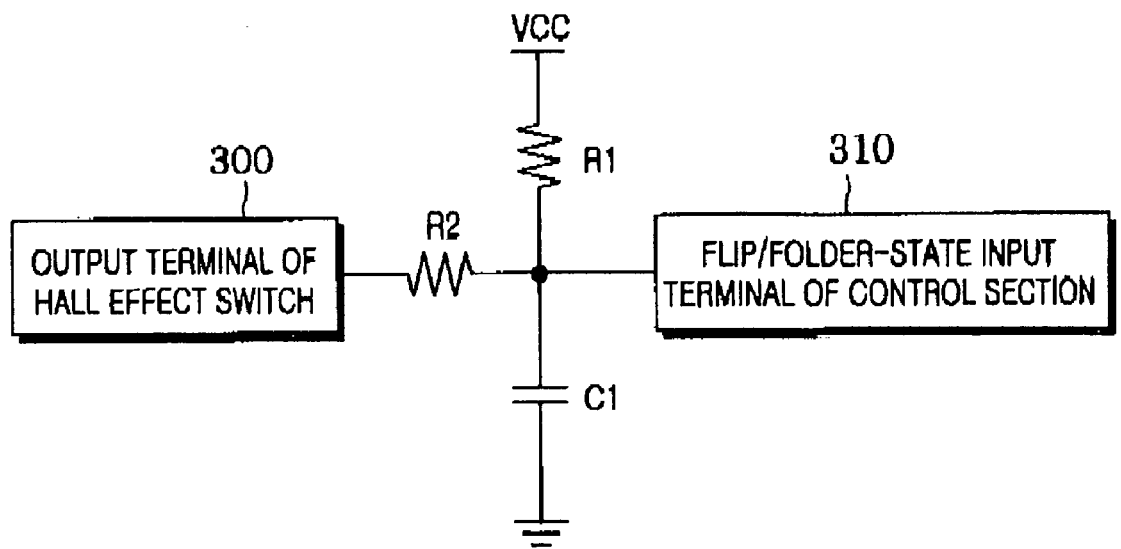
FIG. 3 is a schematic diagram of a circuit for recognizing an open/close state of a flip or a folder of a terminal that processes a malfunction of a hall effect switch according to an embodiment of the present invention.

FIG. 3 is a schematic diagram of a circuit for recognizing an open/close state of a flip or a folder of a terminal that processes a malfunction of a hall effect switch according to an embodiment of the present invention.

Figure 1:
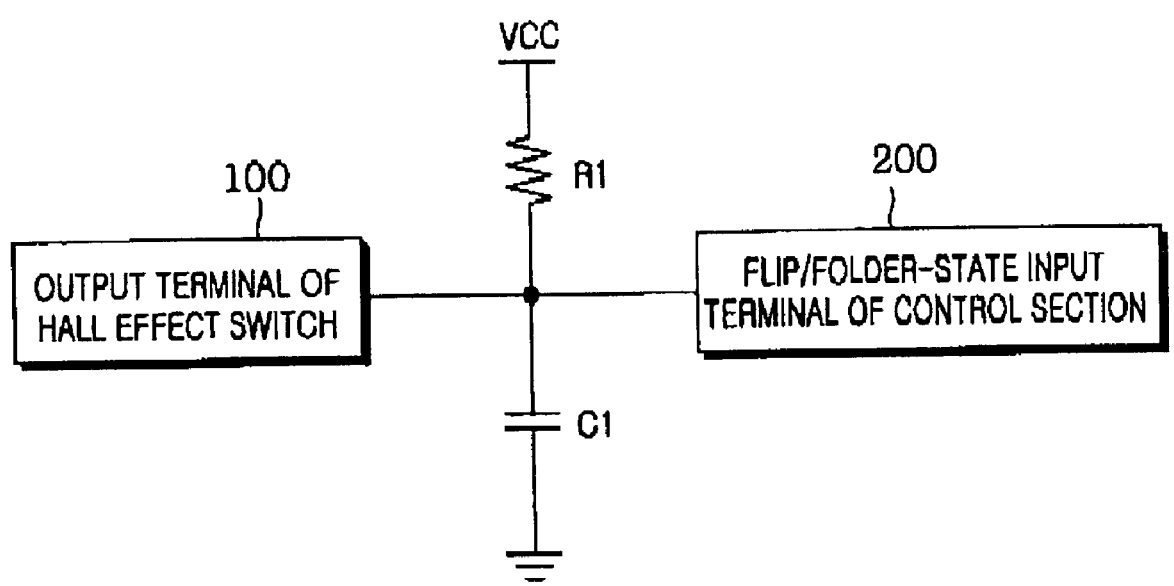
FIG. 1 is a schematic diagram of an apparatus for recognizing an open/close state of a flip or a folder in a conventional terminal.

In comparison to the circuit illustrated in FIG. 1, the circuit illustrated in FIG. 3 additionally includes a resistor R2, and capacities of respective resistors and capacitor are changed. One terminal of the resistor R2 is connected to an output terminal 300 of a hall effect switch, and the other terminal thereof is connected to a connection point of a resistor R1 and a capacitor C1. As a result of the connection of the resistor R2, the low level signal can be determined by (R2/(R1+R2))·Vcc.

The hall effect switch measures the strength of a magnetic field at predetermined intervals (for example, 60 ms), and may use a latch or other equivalent device for maintaining the measured value. Generally, in order for a semiconductor device to recognize a certain signal (for example, a supplied voltage) as a high level signal, the level of the signal should be at least 70% or more of an ideal signal. On the contrary, in order to recognize a certain signal as a low signal, the level of the signal should be at least 30% or less of an ideal signal. In order to satisfy this condition, the ratio of the resistor R1 to the resistor R2 is set by in Equation 1.

$$\frac{R1}{R2} \geq \frac{7}{3} \quad (1)$$

In the Equation 1, the above condition can be satisfied if the resistance values of the resistors R1 and R2 are set to 90KΩ and 10KΩ, respectively. For example, in the circuit illustrated in FIG. 1, the low signal becomes 0 Vcc, when the resistor R1 is 100KΩ, the capacitor is 0.1 µF, and the high level signal is 1 Vcc. However, in the circuit illustrated in FIG. 3, the low signal becomes 0.1 Vcc, when the resistor R1 is 90KΩ, the resistor R2 is 10KΩ, the capacitor C1 is 33 µF, and the high level signal is 1 Vcc.

Figure 2A:
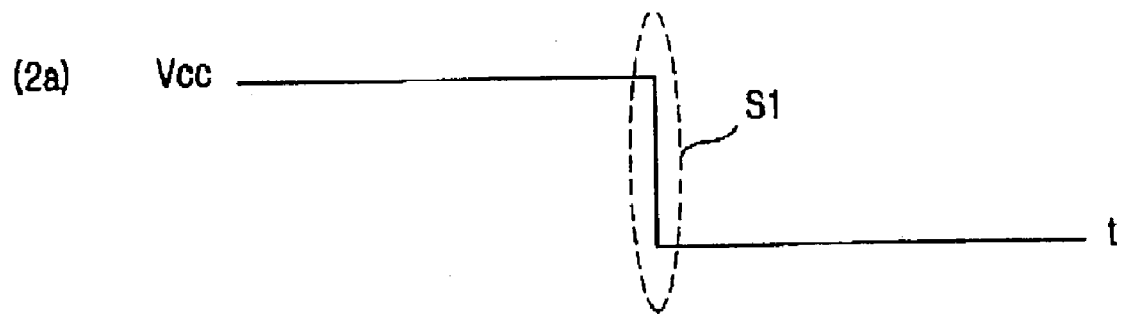
FIGS. 2A and 2B illustrate a normal-state signal and abnormal-state signals outputted from a hall effect switch.
Figure 2B:
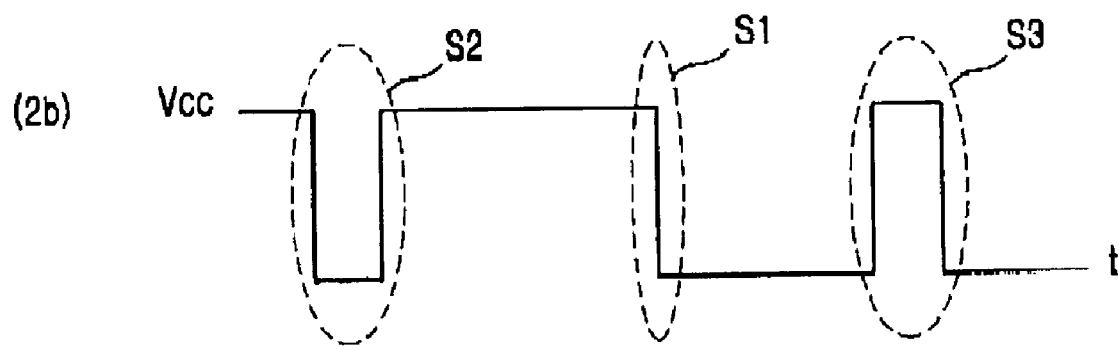

It is assumed that a magnetic field is produced from current flowing through a battery during a user's call. When this happens in the conventional circuit illustrated in FIG. 1, the output of the hall effect switch temporarily changes from a high level signal to a low level signal as illustrated by S2 or S3 in FIG. 2B. However, in the circuit illustrated in FIG. 3, a preferred embodiment of the present invention, the high level signal is maintained as it is, and thus the flip or the folder is prevented from being incorrectly recognized as being closed. That is, a signal, which does not exceed a lower threshold value (i.e., 70% of the ideal signal) due to a time constant τ that is a product of the resistor R2 and the capacitor C1, is applied to the flip/folder-state input terminal 310 of the control section, and this signal can be recognized as the high level signal.

Figure 4:
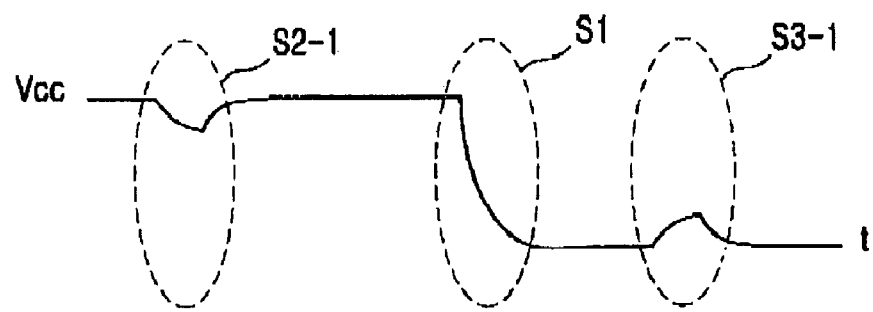
FIG. 4 illustrates a compensated output signal of a hall effect switch according to an embodiment of the present invention.

FIG. 4 illustrates a compensated output signal of a hall effect switch according to an embodiment of the present invention. In FIG. 4, S2-1 and S3-1 correspond to S2 and S3 of FIG. 2B. The control section (not illustrated) of the terminal, which has directly received S2 or S3 of FIG. 2B through the flip/folder-state input terminal 310, recognizes S2 or S3 as the low level signal or the high level signal. However, utilizing the circuit illustrated in FIG. 3, the signal S2-1 or S3-1 transferred to the flip/folder-state input terminal does not exceed the lower threshold value (i.e., 70% of the ideal signal) or an upper threshold value (i.e., 30% of the ideal signal), and thus it can be normally recognized as the high level signal or low level signal.

An instantaneous voltage drop generated for a period t for measuring the strength of the magnetic field is recognized as the normal high-level signal only when it is 30% or less of the voltage. Therefore, the lower threshold value v1(t) can be expressed by Equation 2.

$$v1(t)=Vcc*e^{(-t/\tau)} \geq 0.7Vcc(\tau=R2*C1) \quad (2)$$

In Equation 2, if it is assumed that the period t is 60 msec, the time constant τ is about 0.1682 or more. Thus, when the resistance of the resistor R2 is 10KΩ, the capacitance of the capacitor C1 should be larger than 16.82 µF. Accordingly, the use of the capacitor C1 having a capacitance of 33 µF will satisfy the above-described condition.

When the time constant τ is 0.33, Equation 2 can be expressed as follows.

$$v1(t)=Vcc*e^{-(60\cdot10^{-3})/(0.33\cdot10^{-6})}=0.8Vcc$$

On the contrary, since an instantaneous voltage rise of 30% or less, which is generated for the period t for measuring the strength of the magnetic field, is recognized as the normal low-level signal, the upper threshold value v2(t) can be expressed by the following Equation 3.

$$v2(t)=Vcc*(R2/(R1+R2)+R1/(R1+R2)*(1-e^{(-t/\tau)})+R2/(R1+R2)*(1-e^{(-t/\tau2)})) \leq 0.3Vcc(\tau1=R2*C1, \tau2=R1*C1) \quad (3)$$

Here, if it is assumed that the period t is 60 msec, the time constant τ is about 27.29 or more. Thus, when the resistance of the resistor R1 is 90KΩ and the resistance of the resistor R2 is 10KΩ, the capacitance of the capacitor C1 should be larger than 27.29 µF. Accordingly, as in the above assumption, the use of the capacitor C1 having a capacitance of 33 µF will satisfy the above-described condition.

As a result, in order to perform the method of the present invention, it is necessary to utilize the circuit illustrated in FIG. 3 and that the two resistors R1 and R2, and the capacitor C1 have the resistances and the capacities that satisfy Equations 1 to 3.

Alternatively, the processing of the malfunction of the hall effect switch can also be implemented by software instead of by hardware as described above.

Figure 5:
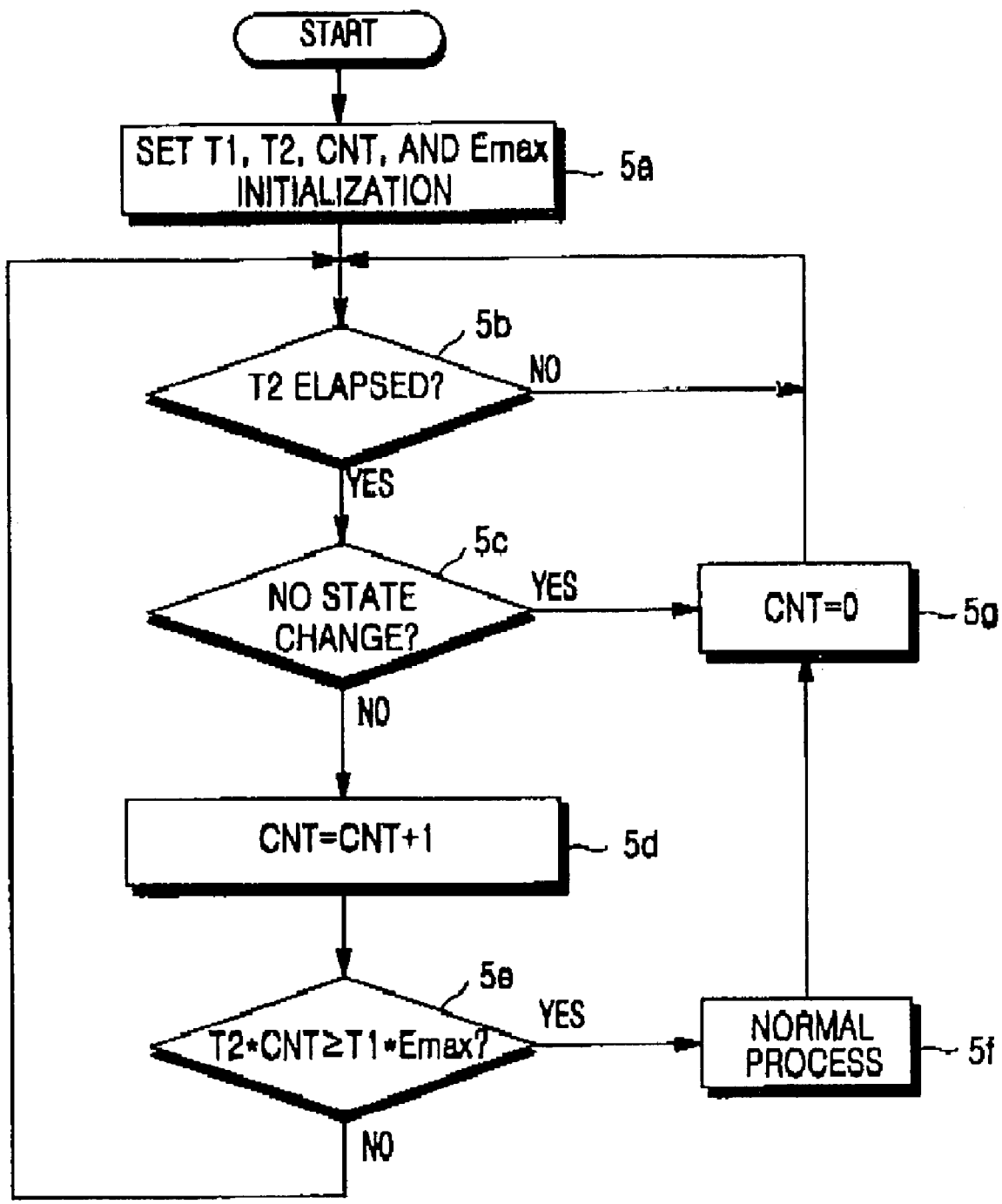
FIG. 5 is a flowchart illustrating a method of processing a malfunction of a hall effect switch according to an embodiment of the present invention.

FIG. 5 is a flowchart illustrating a method for processing a malfunction of the hall effect switch according to an embodiment of the present invention. According to this method, if the signal is not changed for a time longer than the maximum error time, the signal is determined as a normal state. In using this method, the circuit for recognizing the open/close state of the flip or folder as illustrated in FIG. 1 may be used as it stands.

The feature of this method will now be described in detail herein below.

If the control section detects a low level signal when it checks the flip/folder-state input terminal 200 based on a voltage drop or interrupt when the previously detected signal was a high level signal, it cannot be differentiated whether the current change of detected signal is an instantaneous error due to an external interference or is caused by an actual closing of the flip or folder. In this case, the control section twice operates a timer having a period (for example, 50 ms) shorter than a sampling period (for example, 60 ms) of the hall effect switch, and if the low level signal is detected twice in succession, it recognizes it as the closing of the flip or folder. However, if a high level signal is detected even once during the two-time operation of the timer, the control section recognizes the change as an instantaneous error, and disregards the change. In other words, the control section does not recognize the change as the closing of the flip or folder.

In the same manner, if the control section detects a high level signal when it checks the flip/folder-state input terminal 200 when the previously detected signal was a low level signal, it cannot be differentiated whether the current change of detected signal is an instantaneous error due to an external interference or is caused by an actual opening of the flip or folder. In this case, the control section twice operates the timer having the period shorter than the sampling period of the hall effect switch, and if the high level signal is detected twice in succession, it recognizes it as the opening of the flip or folder. However, if a low level signal is detected even once during the two-time operations of the timer, the control section recognizes the change as an instantaneous error, and disregards the change. In other words, the control section does not recognize the change as the opening of the flip or folder.

The judgment effected by operating the timer twice as described above is based on the assumption that the error is not generated in succession. However, if this assumption is disregarded, i.e., if it is considered that the error can be generated in succession, it should satisfy the following Equation 4.

$$T2*CNT \geq T1*Emax \quad (4)$$

Here, T1 represents the sampling period of the hall effect switch, i.e., the period (for example, 60 ms) for detecting the strength of the magnetic field, and T2 represents the period (for example, 50 ms) when the control section momentarily checks the flip/folder-state input terminal 200 if the state change of the signal input to the flip/folder-state input terminal 200 is detected. This is for confirming whether the change is due to an error or not. Also, CNT represents the operational frequency of a timer (i.e., second timer) for implementing the period T2, and Emax represents the maximum number of successive errors of the hall effect switch. This maximum number of successive errors may be obtained from experiments.

For example, if the maximum number of successive errors is 2 in a state that the sampling period of the hall effect switch is 60 ms, the instantaneous errors may be maintained for 120 ms. In other words, the maximum (i.e., the worst) time period for which the errors can be generated is 120 ms. Thus, in this case, the error can be checked, for example, by operating three times the timer of 50 ms, which is a time period shorter than the sampling period of the hall effect switch.

As stated above, FIG. 5 is a flowchart illustrating a method for processing a malfunction of a hall effect switch according to an embodiment of the present invention. According to this method, both the successive error generation and the non-successive error generation are considered.

In step 5a, the control section (not illustrated) of the terminal performs the initialization. The initialization includes the sampling period T1 of the hall effect switch, the period T2 when the control section momentarily checks the flip/folder-state input terminal 310 if the state change of the signal inputted to the flip/folder-state input terminal 310 is detected, the operational frequency CNT of the second timer for implementing the period T2, and the maximum number of successive errors Emax of the hall effect switch.

In step 5b, the control section checks whether the period T2 (for example, 50 ms) has elapsed. If the period T2 elapses, the control section checks whether the present state of the signal outputted from the hall effect switch, i.e., the present state of the signal sensed through the flip/folder-state input terminal 310 is identical to the previously sensed signal in step 5c. If the presently sensed signal is identical to the previously sensed signal, the control section proceeds to step 5g to reset the counter, and then returns to the step 5b.

On the contrary, if the presently sensed signal is different from the previously sensed signal in step 5c, the control section recognizes this as an opening/closing of the flip or the folder, or the incorrect recognition. The control section performs the following steps to discriminate whether or not the change of the detected signal is due to the wrong recognition.

In step 5d, the control section increases the CNT by 1, and then proceeds to step 5e to check whether the CNT is larger than the Emax. At this time, if the CNT is not larger than the Emax, the control section returns to the step 5b. Conversely, if the CNT is larger than the Emax, the control section proceeds to step 5f to perform a normal process, proceeds to the step 5g to reset the CNT, and then returns to the step 5b.

As described above, the present invention removes an inconvenience in using a flip type or a folder type terminal by preventing an opening or closing of the flip or the folder of the terminal from being incorrectly recognized. For example, even if the output of the hall effect switch is instantaneously changed due to the current flowing from the battery during calling, the terminal does not incorrectly recognize this as the closing of the flip or folder, and thus the disconnection of the call is prevented to effect a stable connection.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A circuit for processing a malfunction of a hall effect switch used for recognition of an open/close state of a flip or a folder of a terminal, the circuit comprising:

an output terminal of the hall effect switch for outputting a first-state or a second-state signal that indicates the open/close state of the flip or the folder by sensing a change of a magnetic field according to an opening/closing of the flip or the folder;

a flip/folder-state input terminal for transferring the first-state or the second-state signal to a control section of the terminal;

a first pull-up resistor connected to the flip/folder-state input terminal;

a ripple-removing capacitor connected to the flip/folder-state input terminal; and a second resistor of which one terminal is connected to the output terminal of the hall effect switch and the other terminal is connected to a connection point of the first pull-up resistor and a capacitor.

2. The circuit as claimed in claim 1, wherein a ratio of the first pull-up resistor (R1) to the second resistor (R2) is set by $$\frac{R1}{R2} \geq \frac{7}{3},$$

and a lower threshold value v1(t) and an upper threshold value v2(t), whereby a signal provided to the flip/folder-state input terminal is recognized as the first state or the second state, satisfy following equations, respectively.

$v1(t)=Vcc*e^{(-t/\tau)} \geq 0.7 Vcc (\tau=R2*C1,$ t: a period where the hall effect switch measures a strength of the magnetic field)

$v2(t)=Vcc*(R2/(R1+R2)+R1/(R1+R2)*(1-e^{(-t/\tau 1)})+ R2/(R1+R2)*(1\ e^{(-t/\tau 2)})) \leq 0.3\ Vcc (\tau 1=R2*C1, \tau 2=R1*C1).$ 3. A method for processing a malfunction of a hall effect switch used for recognition of an open/close state of a flip or a folder of a terminal, the method comprising:

(i) performing an initialization for setting a first period T1 for detecting a strength of a magnetic field, a second period T2 for checking a state change of a signal inputted to a flip/folder-state input terminal of a control section, an operational frequency CNT of a timer for checking expiration of the second period, and a maximum number of successive errors Emax of the hall effect switch, satisfying T2*CNT≧T1*Emax;

(ii) checking if a state of the signal outputted from the hall effect switch and sensed through the flip/folder-state input terminal of the control section is equal to that of a previously sensed signal if the second period expires after the first step is performed;

(iii) increasing the operational frequency of the timer by 1 and then checking whether T2*CNT≧T1*Emax is satisfied if the state of the presently sensed signal is different from that of the previously sensed signal at the second step; and (iv) recognizing the present state as an opening/closing of the flip or the folder if T2*CNT≧T1*Emax is satisfied at (iii).

4. The method as claimed in claim 3, further comprising resetting the operational frequency of the timer and returning to (ii) if the state of the presently sensed signal is equal to that of the previously sensed signal at (ii) or after performing (iv).

5. The method as claimed in claim 3, wherein the second period T2 is relatively shorter than the first period T1.

* * * * *